United States Patent
Hiramatsu et al.

(10) Patent No.: US 6,936,343 B1
(45) Date of Patent: Aug. 30, 2005

(54) CERAMIC SUBSTRATE

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/807,960
(22) PCT Filed: May 15, 2000
(86) PCT No.: PCT/JP00/03081
§ 371 (c)(1),
(2), (4) Date: May 18, 2001
(87) PCT Pub. No.: WO01/67817
PCT Pub. Date: Sep. 13, 2001

(30) Foreign Application Priority Data

Mar. 6, 2000 (JP) ........................................ 2000-060319

(51) Int. Cl.⁷ .............................. B32B 3/26; H05B 3/44
(52) U.S. Cl. .................. 428/314.8; 219/510; 428/315.7
(58) Field of Search ................................ 428/209, 210, 428/901; 219/544, 385, 465.1

(56) References Cited

U.S. PATENT DOCUMENTS

| | | | | |
|---|---|---|---|---|
| 4,608,316 A | * | 8/1986 | Toda et al. ................. 428/446 |
| 5,144,536 A | * | 9/1992 | Tsukada et al. ............. 361/402 |
| 5,279,886 A | * | 1/1994 | Kawai et al. ............... 428/209 |
| 5,338,598 A | * | 8/1994 | Ketcham .................... 428/210 |
| 5,412,160 A | * | 5/1995 | Yasumoto et al. .......... 174/258 |
| 5,635,301 A | * | 6/1997 | Kondo et al. ............... 428/426 |
| 5,683,606 A | * | 11/1997 | Ushikoshi et al. .......... 219/544 |
| 5,686,172 A | * | 11/1997 | Ohya et al. ................. 428/210 |
| 5,925,451 A | * | 7/1999 | Ohya et al. ............... 428/307.3 |
| 6,452,137 B1 | * | 9/2002 | Kariya ........................ 219/544 |
| 6,465,763 B1 | * | 10/2002 | Ito et al. .................. 219/444.1 |
| 6,475,606 B2 | | 11/2002 | Niwa |
| 6,507,006 B1 | | 1/2003 | Hiramatsu et al. |
| 6,677,557 B2 | * | 1/2004 | Ito et al. .................. 219/465.1 |
| 2002/0043527 A1 | | 4/2002 | Ito |
| 2002/0043530 A1 | | 4/2002 | Ito |
| 2002/0055021 A1 | | 5/2002 | Niwa |
| 2003/0015521 A1 | | 1/2003 | Ito |

FOREIGN PATENT DOCUMENTS

| | | |
|---|---|---|
| EP | 0 940 845 | 9/1999 |
| JP | 2-275765 | 11/1990 |
| JP | 5-008140 | 1/1993 |
| JP | 11-312570 | 11/1999 |
| JP | 11-312729 | 11/1999 |
| JP | 11-343168 | 12/1999 |
| JP | 2000-058631 | 2/2000 |

* cited by examiner

Primary Examiner—Cathy Lam
(74) Attorney, Agent, or Firm—Oblon, Spivak, McClelland, Maier & Neustadt, P.C.

(57) ABSTRACT

An object of the present invention is to provide a ceramic substrate that is superior in temperature rising/dropping characteristics and breakdown voltage at a high temperature, has a small warp amount, and is best as a substrate for semiconductor-producing/examining devices. The ceramic substrate of the present invention is a ceramic substrate having a conductor formed on the surface thereof or inside thereof, characterized in that said ceramic substrate is having $15 \times 10^{11}$ or less pores which have a diameter of 0.5 μm or more per m².

10 Claims, 9 Drawing Sheets

CERAMIC SUBSTRATE

TECHNICAL FIELD

The present invention relates to a ceramic substrate used mainly in the semiconductor industry, and in particular to a ceramic substrate that is high in breakdown voltage, is superior in the ability of adsorption of a semiconductor wafer in the case that the substrate is used as an electrostatic chuck, and is superior in temperature rising/dropping characteristics in the case that the substrate is used as a hot plate (heater).

BACKGROUND ART

A semiconductor is a very important product necessary in various industries. A semiconductor chip is produced, for example, by slicing a silicon monocrystal into a given thickness to make a silicon wafer and then forming plural integrated circuits and so on in the silicon wafer.

In the process for producing this semiconductor chip, the silicon wafer put on an electrostatic chuck is subjected to various treatments such as etching and CVD, so as to form conductor circuits, elements and so on. Since a corrosive gas is used as a gas for deposition, a gas for etching, and the like at this time, it is necessary to protect an electrostatic electrode layer from corrosion by these gases. The electrostatic electrode layer is usually covered with a ceramic dielectric film and the like because of the necessity of protecting an electrostatic electrode from above mentioned gases and the necessity of induction of adsorption power.

As this ceramic dielectric film, nitride ceramics have been hitherto used. For example, Japanese Kokai Publication Hei 5-8140 discloses an electrostatic chuck z using a nitride such as aluminum nitride. Japanese Kokai Publication Hei 9-48668 also discloses a carbon-containing aluminum nitride having an Al—O—N structure.

SUMMARY OF THE INVENTION

However, electrostatic chucks using such ceramics have the following problems: temperature rising/dropping characteristics are insufficient; breakdown voltage drops at a high temperature; and Young's modulus drops so that a warp is caused.

It was found that such problems arise not only in electrostatic chucks but also in ceramic substrates for producing/examining semiconductors, wherein conductors are formed on or inside the ceramic substrate like a hot plate, a wafer prober and the like.

The inventors made eager investigations to solve the above-mentioned problems. As a result, it has been found that degradation in the temperature rising/dropping characteristics, the breakdown voltage and Young's modules of such a ceramic substrate are caused by insufficient sintering properties, and it has newly been found that by controlling the degree of sintering in the manner that the number of pores contained in a ceramic substrate and having a diameter of 0.5 µm or more will be $15 \times 10^{11}$ per m$^2$ or less, the above-mentioned problems can be solved. Specifically, it has found that the number of the above-mentioned pores having a diameter of 0.5 µm or more can be set to $15 \times 10^{11}$ per m$^2$ or less, for example, by adjusting the diameter of ingredient particles of a ceramic at first, oxidizing the surfaces of the ingredient particles of the ceramic, followed by adding an oxide and adjusting pressure at the time of sintering. Thus, the present invention has been completed.

In the present invention, the unit of the number of pores is made to "per/m$^2$". However, in the case of a ceramic substrate having an area of less than 1 m$^2$, it would be proper that the unit is made to "per cm$^2$". However, the unit is made to "per m$^2$" from the viewpoint that SI units should be used as much as possible. Of course, for conversion to "per cm$^2$", it is advisable that the value based on "per m$^2$" should be multiplied by $10^{-4}$.

Namely, the present invention is a ceramic substrate having a conductor formed on the surface thereof or inside thereof, characterized in that said ceramic substrate is having $15 \times 10^{11}$ or less pores having a diameter of 0.5 µm or more per m$^2$.

BRIEF DESCRIPTION OF THE DRAWINGS

FIG. 11 is a sectional view that schematically shows the condition that an electrostatic chuck according to the present invention is fitted into a supporting case.

FIG. 12 is a sectional view that schematically shows a wafer prober using a ceramic substrate of the present invention.

Figure 1:
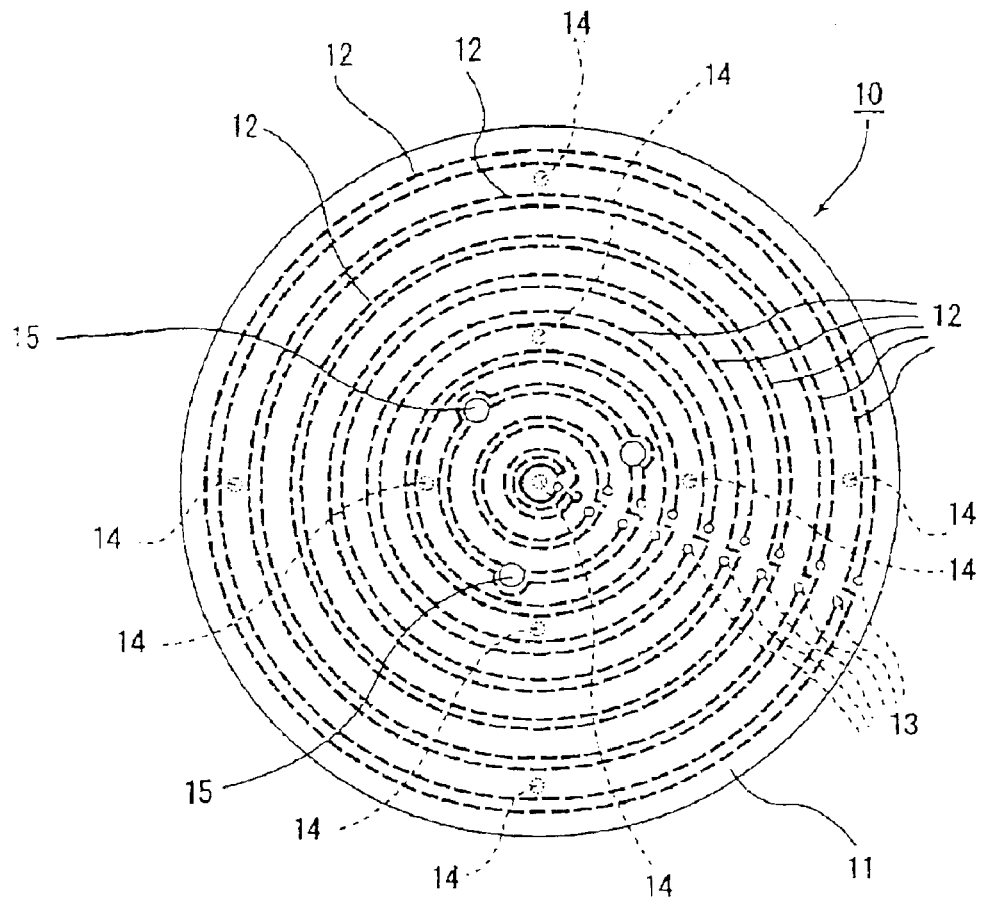
FIG. 1 is a plain view that schematically shows one example of a ceramic heater using a ceramic substrate of the present invention.

| Explanation of the Symbol | |
|---|---|
| 1, 11, 63 | ceramic substrate |
| 2, 22, 32a, 32b | chuck positive electrostatic layer |
| 3, 23, 33a, 33b | chuck negative electrostatic layer |
| 2a, 3a | semicircular part |
| 2b, 3b | comb-shaped part |
| 4 | ceramic dielectric film |

-continued

| Explanation of the Symbol | |
|---|---|
| 5, 12, 25, 61 | resistance heating element |
| 6, 13, 18 | external terminal |
| 7 | metal wire |
| 8 | Peltier device |
| 9 | silicon wafer |
| 10 | ceramic heater |
| 14 | bottomed hole |
| 15 | through hole |
| 16, 17, 19 | plated through hole |
| 20, 30, 101, 201, 301, 401 | electrostatic chuck |
| 25a | metal covering layer |
| 35, 36 | blind hole |
| 41 | supporting case |
| 42 | coolant outlet |
| 43 | inhalation duct |
| 44 | coolant inlet |
| 45 | heat insulator |
| 62 | chuck top conductor layer |
| 65 | guard electrode |
| 66 | ground electrode |
| 66a | electrode non-formed area |
| 67 | groove |
| 68 | suction hole |
| 501 | wafer prober |

DETAILED DESCRIPTION OF THE INVENTION

The ceramic substrate of the present invention is a ceramic substrate having a conductor formed on the surface thereof or inside thereof, characterized in that said ceramic substrate is having $15 \times 10^{11}$ or less pores which have a diameter of 0.5 μm or more per m².

In the ceramic substrate of the present invention, the number of pores that are present in the ceramic substrate and have a diameter of 0.5 μm or more is $15 \times 10^{11}$ per m² or less. If the number of the pores that have a diameter of 5 μm or more is in such level, the temperature rising/dropping characteristics of the above-mentioned ceramic substrate, the breakdown voltage and Young's module thereof at a high temperature are superior. Therefore, no warp is caused in the ceramic substrate even at a high temperature of about 400 to 500° C.

In the present invention, the diameter and the number of pores can be controlled, for example, by adjusting the diameter of ingredient particles of a nitride ceramic at first and then adjusting pressure, pressing time, temperature and so on at the time of sintering. Thus, the number of the pores that are present in such a sintered body and have a diameter of 0.5 μm or more are set to $15 \times 10^{11}$ per m² or less.

As the diameter of the ingredient particles of the nitride ceramic is smaller, the diameter of the pores contained in the ceramic substrate becomes smaller but the number of the pores increases. As the pressure, the pressing time and a sintering temperature at the time of sintering the nitride ceramic become higher or longer, the diameter of the pores contained in the ceramic substrate becomes smaller and the number of the pores also decreases. However, if the pressing time is too long or the sintering temperature is too high, grain-growth advances excessively so that grains constituting the sintered product become enormous. On the other hand, an appropriate range of the pressure and so on vary according to the kind of the ceramic. It is therefore desired that the diameter of the ingredient particles of the nitride ceramic, the pressure upon sintering the nitride ceramic particles, and so on are appropriately adjusted according to the kind of the ceramic substrate to be produced.

Said oxide to be added is preferably an oxide of the element constituting the ingredient particles of the nitride ceramic. This is because the above oxide is the same as the material of an oxidized surface layer of the ingredient particles of the nitride ceramic and helps smooth sintering. In order to oxidize the surface of the ingredient particles of the nitride ceramic, it is desired to fire it at 500–1000° C. in oxygen or the air.

The average particle diameter of ceramic powder used in the sintering is preferably from 0.1 to 5 μm. This is because such powder is easily sintered.

Furthermore, it is desired that silica or a sulfur compound is added to the ingredient powder in the manner that the amount of Si after the sintering is 0.05–50 ppm or the amount of the sulfur compound after the sintering is 0.05–80 ppm (by weight in both the cases) in the ceramic substrate. This is considered to be because these compounds connect the oxidized film on the surface of the ingredient particles of the nitride ceramic to the added oxide.

The pressure applied upon the sintering is preferably from 0 to 200 kgf/cm². This is because the diameter and the number of the formed pores can be suppressed and within this range it is possible to keep the breakdown voltage, Young's module and so on of the produced ceramic substrate. Other sintering conditions will be described in detail in connection to the process for producing an electrostatic chuck later.

It is desired that the ceramic substrate obtained by sintering in the above-mentioned manner contains 0.05–10% by weight of oxygen. If the amount thereof is below 0.05% by weight, the sintering does not advance so that porosity becomes higher and thermal conductivity is lowered. On the other hand, if the amount of oxygen is over 10% by weight, said oxygen is segregated in grain boundaries so that the amount of oxygen in the grain boundaries becomes too large. As a result, the thermal conductivity is lowered so that the temperature rising/dropping characteristics are degraded.

In the present invention, it is desired that the ceramic substrate is made of a nitride ceramic containing oxygen and further the diameter of its maximum pores is 50 μm or less. The porosity thereof is desirably 5% or less. It is also desired that the ceramic substrate has no pores or, if any, the diameter of the maximum pores is 50 μm or less.

In the case that no pores are present, the breakdown voltage at a high temperature becomes particularly high. By contrary, in the case that the pores are present, the value of fracture toughness becomes high. Therefore, which design is selected varies according to required characteristics.

The reason why the fracture toughness value is raised by the presence of the pores is not clear. It is, however, presumed that the development of cracks is stopped by the pores.

The reason why the diameter of the maximum pores is desirably 50 μm or less in the present invention is that if the diameter of the pores is over 50 μm, it becomes difficult to keep the breakdown voltage characteristic at a high temperature, in particular at 200° C. or higher.

The diameter of the maximum pores is desirably 10 μm or less. This is because the amount of a warp at 200° C. or higher becomes small.

As described above, the number of the pores and the diameter thereof can be controlled by adjusting the particle diameter of the ingredient particles, the pressure upon the sintering, and so on. Besides, they can be controlled by an additive such as SiC or BN. This is because pores can be introduced since SiC or BN inhibits the sintering.

In the measurement of the number of the pores, 5 samples are prepared. Their surfaces are polished into mirror planes. Any ten points in the surfaces are photographed with 2000–5000 magnifications through an electron microscope. From the taken photographs, the number of pores having a diameter of 0.5 μm or more is counted. The average value thereof is then obtained. It is divided by the area of the field of view. The length of the longest portion of a pore is defined as the diameter of the pore.

Porosity is measured by Archimedes' method. A sintered product is crashed to pieces, and then the crashed product is put into an organic solvent or mercury to measure the volume. True specific gravity is calculated from the weight and the volume of the crashed product. The porosity is calculated from the true specific gravity and the apparent specific gravity.

It is desired that the diameter of the ceramic substrate of the present invention is 200 mm or more, and it is particularly desired that the diameter is 12 inches (300 mm) or more. This is because such a substrate will be the main stream of semiconductor wafers in the next generation. This is also because a problem on the warp to be solved by the present invention does not easily occur on the ceramic substrates having a diameter of 200 mm or less.

It is desired that the thickness of the ceramic substrate of the present invention is 50 mm or less and it is particularly desired that the thickness is 25 mm or less.

If the thickness of the ceramic substrate is over 25 mm, the thermal capacity of the ceramic substrate is occasionally too large. In particular, this is because if a temperature control means is set up to heat and cool the substrate, temperature-following ability is occasionally lowered because of the large thermal capacity.

This is also because the problem on the warp to be solved by the present invention does not arise easily with respect to ceramic substrates having a thickness over 25 mm.

The optimal thickness of the ceramic substrate is particularly 5 mm or less. The thickness of the ceramic substrate is desirably 1 mm or more.

The ceramic material constituting the ceramic substrate of the present invention is not particularly limited. A nitride ceramic or a carbide ceramic is preferable. The nitride ceramic may be a metal nitride ceramic, for example, aluminum nitride, silicon nitride, boron nitride, titanium nitride and the like.

The carbide ceramic may be, for example, silicon carbide, titanium carbide, tantalum carbide, tungsten carbide, zirconium carbide, and the like.

The oxide ceramic may be, for example, alumina, silica, yttria, beryllia, and the like.

Among these ceramics, aluminum nitride is particularly preferable. This is because it has the highest thermal conductivity, that is, 180 W/m·K.

In the present invention, the ceramic substrate desirably contains an oxide. As the oxide, for example, an alkali metal oxide, an alkali earth metal oxide, or a rare earth oxide can be used. Among these sintering aids, CaO, $Y_2O_3$, $Na_2O$, $Li_2O$ and $Rb_2O$ are particularly preferable. Alumina or silica may also be used. The content thereof is desirably from 0.1 to 20% by weight.

Alumina is best as an oxide to be added, particularly in the case of aluminum nitride. In the case of silicon nitride, silica is best.

In the present invention, it is desired that the ceramic substrate contains 5–5000 ppm of carbon.

This is because incorporation of carbon makes it possible to blacken the ceramic substrate and use sufficient radiant heat at the time of use as a heater.

Carbon may be amorphous or crystal. In the case of using amorphous carbon, a drop in volume resistivity can be prevented at a high temperature. In the case of using crystal carbon, a drop in thermal conductivity can be prevented at a high temperature. Therefore, both of crystal carbon and amorphous carbon may be used together depending on uses. The carbon content is more preferably from 50 to 2000 ppm.

In the case that carbon is incorporated in the ceramic substrate, it is desired that carbon is incorporated in the manner that its brightness is made to N4 or less as a value based on the regulation according to JIS Z 8721. The ceramic substrate having such a brightness is superior in the quantity of radiant heat and covering ability.

The brightness N represents a brightness scale with the brightness of ideal black being taken as 0 and the brightness of ideal white as 10 and the brightness of a sample is expressed on the scale divided in 10 at equal intensity intervals of perceptual brightness, as N0 to N10.

In actual measurement, a comparison is made with color cards corresponding to N0 to N10. In this case, decimal fractions are rounded to 0 or 5.

The ceramic substrate of the present invention is a ceramic substrate used in devices for producing or examining semiconductors. Examples of specific devices include an electrostatic chuck, a hot plate (ceramic heater), and a wafer prober and so on.

In the case that the conductor formed inside the ceramic substrate is a resistance heating element, the ceramic substrate can be used as a, ceramic heater (hot plate).

Figure 2:
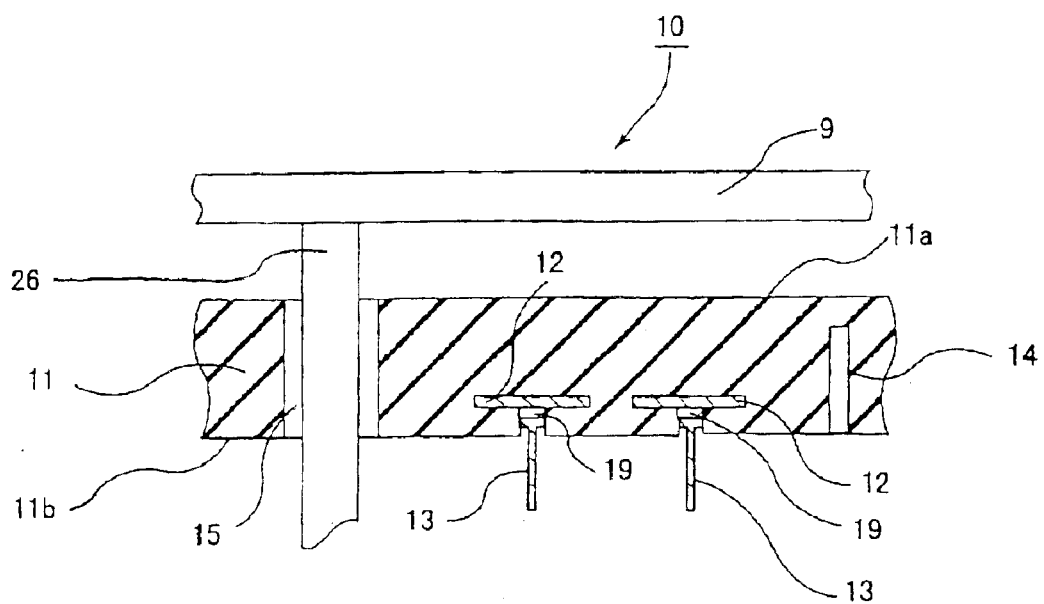
FIG. 2 is an enlarged partial sectional view of the ceramic heater shown in FIG. 1.

FIG. 1 is a plain view that schematically shows an example of a ceramic heater that is one embodiment of the ceramic substrate of the present invention. FIG. 2 is an enlarged partial sectional view showing a part of the ceramic heater shown in FIG. 1.

A ceramic substrate 11 is made in a disk form. Inside the ceramic substrate 11, resistance heating elements 12 as temperature control means are formed in the pattern of concentric circles. About these resistance heating elements 12, two concentric circles close to each other are connected to produce one line as a circuit, and external terminals 13 that become inputting/outputting terminals are connected to both ends of the circuit via plated through holes 19.

As shown in FIG. 2, through holes 15 are made in the ceramic substrate 11, and support pins 26 are inserted into the through holes 15 to support a silicon wafer 9.

By moving the support pins 26 up and down, it is possible to receive the silicon wafer 9 from a carrier machine, put the silicon wafer 9 on a wafer-treating surface 11a of the ceramic substrate 11 and heat the silicon wafer 9, or support the silicon wafer 9 in the state that the silicon wafer 9 is apart from the wafer-treating surface 11a at a distance of about 50–2000 μm and heat the silicon wafer 9. Bottomed holes 14 into which temperature-measuring elements such as thermocouples are inserted are made in a bottom surface 11b of the ceramic substrate 11. When an electric current is applied to the resistance heating elements 12, the ceramic substrate 11 is heated so that a product such as a silicon wafer and so on can be heated.

Also, after forming an through hole or a concave portion in the ceramic substrate, a support pin whose tip is in a spire form or a hemispheric form is inserted into the through hole or the concave portion. Then this support pin is fixed in the state that the pin projects out slightly from the ceramic substrate. With these pins, the silicon wafer is supported in the state that the wafer is apart from the heating surface at a distance of about 50–2000 μm and can be heated.

In the ceramic substrate 11 constituting this hot plate, the number of pores having a diameter of 0.5 μm or more is as small as $15 \times 10^{11}$ per $m^2$ or less. Thus, the ceramic substrate 11 is sintered fine enough. Therefore, in this ceramic substrate 11 its temperature rising/dropping characteristics are superior, and its breakdown voltage and Young's module at a high temperature do not drop. No warp are generated in the ceramic substrate even at a high temperature of 400 to 500° C.

The resistance heating elements may be arranged inside the ceramic substrate or on the bottom surface of the ceramic substrate. In the case that the resistance heating elements are set up, inlets for blowing a coolant, such as air, as a cooling means may be made in a supporting case into which the ceramic substrate is fitted.

In the case that the resistance heating elements are arranged inside the ceramic substrate, the elements may be made of plural layers. In this case, the patterns of the respective layers may be formed to complement them mutually. One of the patterns is desirably formed on any one of the layers when being viewed from the heating surface. For example, a structure having a staggered arrangement is desirable.

Examples of the resistance heating element include sintered products made of a metal or a conductive ceramic, a metal foil, and a metal wire. As the metal sintered product, at least one selected from tungsten and molybdenum is preferable. This is because these metals are not relatively liable to be oxidized, and have a sufficient resistance value for generating heat.

As the conductive ceramic, at least one selected from carbides of tungsten and molybdenum can be used.

In the case that the resistance heating elements are formed on the bottom surface of the ceramic substrate, it is desired to use noble metals (gold, silver, palladium and platinum), or nickel as the metal sintered product. Specifically, silver, silver-palladium, and the like can be used.

As metal particles used in the metal sintered product, spherical particles, scaly particles, or a mixture of spherical particles and scaly particles can be used.

When the resistance heating elements are formed on the surface of the ceramic substrate, it is allowable to add a metal oxide to a metal and sinter the mixture. The reason why the above-mentioned metal oxide is used is that the ceramic substrate and particles of the metal are caused to adhere closely to each other by the oxide. The reason why the close adhesiveness between the ceramic substrate and the metal particles is improved by the metal oxide is not clear, but suspected to be as follows. Thus, an oxidized film is slightly formed on the surface of the metal particles. The oxidized film is also formed on the surface of the ceramic substrate not only in the case that the ceramic substrate is made of an oxide but also in the case that the ceramic substrate is made of a non-oxide ceramic. It can be therefore considered that these oxidized films are cosintered and integrated on the surface of the ceramic substrate through the metal oxide so that the metal particles and the ceramic substrate adhere closely to each other.

As the metal oxide, at least one selected from, for example, lead oxide, zinc oxide, silica, boron oxide ($B_2O_3$), alumina, yttria, and titania is preferable. This is because these oxides improve the close adhesiveness between the metal particles and the ceramic substrate without increasing the resistance value of the resistance heating elements.

The amount of the metal oxide is desirably between the range of 0.1 or more and less than 10 parts by weight per 100 parts by weight of the metal particles. This is because by using the metal oxide within this range, the resistance value does not become excessively large and the close adhesiveness between the metal particles and the ceramic substrate can be improved.

When the total amount of the metal oxides is regarded as 100 parts by weight, the ratios of lead oxide, zinc oxide, silica, boron oxide ($B_2O_3$), alumina, yttria and titania are preferably as follows: lead oxide: 1–10 parts by weight; silica: 1–30 parts by weight; boron oxide: 5–50 parts by weight; zinc oxide: 20–70 parts by weight; alumina: 1–10 parts by weight; yttria: 1–50 parts by weight; and titania: 1–50 parts by weight. However, these amounts are preferably adjusted within the scope that the total of these amounts is not over 100 parts by weight. This is because within above ranges it is possible to particularly improve the close adhesiveness to the ceramic substrate.

Figure 5:
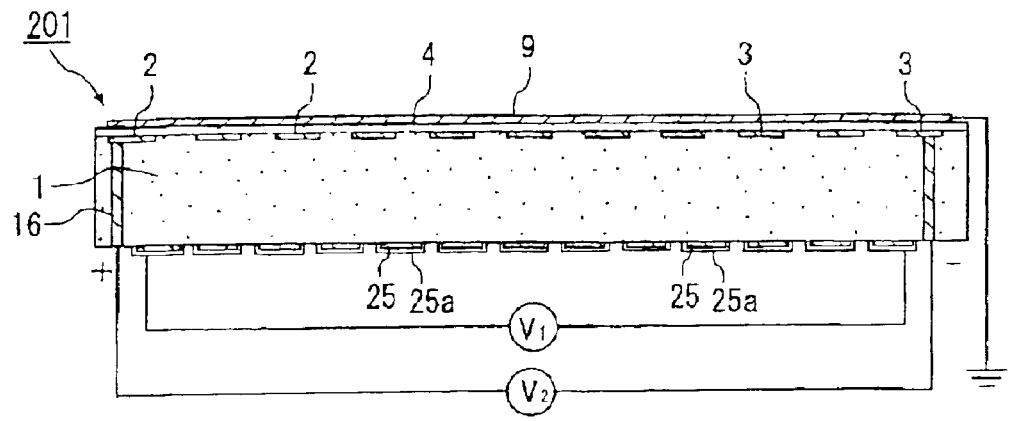
FIG. 5 is a sectional view that schematically shows one example of an electrostatic chuck using a ceramic substrate of the present invention.

In the case that the resistance heating elements are arranged on the bottom surface of the ceramic substrate, it is desired to cover the surfaces of the resistance heating elements 25 with metal layer 25a (see FIG. 5). The resistance heating elements 25 are sintered products made of the metal particles. If the resistance heating elements 25 are exposed, they are easily oxidized. This oxidization causes a change in the resistance value. Thus, by covering the surfaces with the metal layers 25a, oxidization can be prevented.

The thickness of the metal layer 25a is desirably from 0.1 to 100 μm. This is because within in this range it is possible to prevent oxidization of the resistance heating elements without changing the resistance value of the resistance heating elements.

The metal used for the covering should be a non-oxidizable metal. Specifically, at least one selected from gold, silver, palladium, platinum, and nickel is preferable. Among these metals, nickel is more preferable. This is because; terminals for the connection to a power source are necessary in the resistance heating elements, therefore the terminals are attached to the resistance heating elements through solder. There, nickel prevents solder from being thermally diffused. As the connecting terminals, external terminals made of koval may be used.

In the case that the resistance heating elements are formed inside the ceramic substrate, covering is unnecessary since the surfaces of the resistance heating elements are not oxidized. In the case that the resistance heating elements are formed inside a ceramic substrate, a part of the surfaces of the resistance heating elements may be exposed.

As the resistance heating elements, a metal foil or metal wire may be used. As the metal foil, resistance heating elements prepared by etching nickel foil or stainless steel foil into a pattern is desirable. The patterned metal foils may be put on each other with a resin film and the like. Examples of the metal wire include a tungsten wire, and a molybdenum wire.

In the case that the conductor formed inside the ceramic substrate is an electrostatic electrode layer, the ceramic substrate can be used as an electrostatic chuck. In this case, an RF electrode or a resistance heating element may be formed as conductor below the electrostatic electrode and inside the ceramic substrate.

Figure 3:
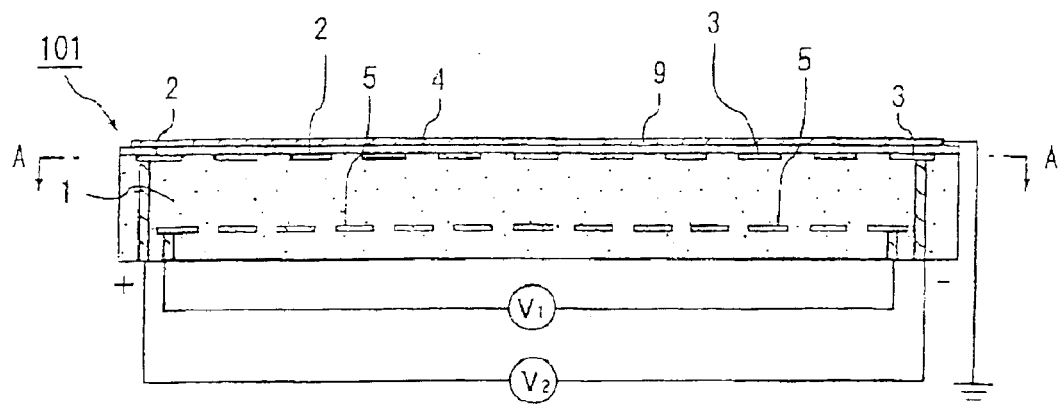
FIG. 3 is a sectional view that schematically shows one example of an electrostatic chuck using a ceramic substrate of the present invention.
Figure 4:
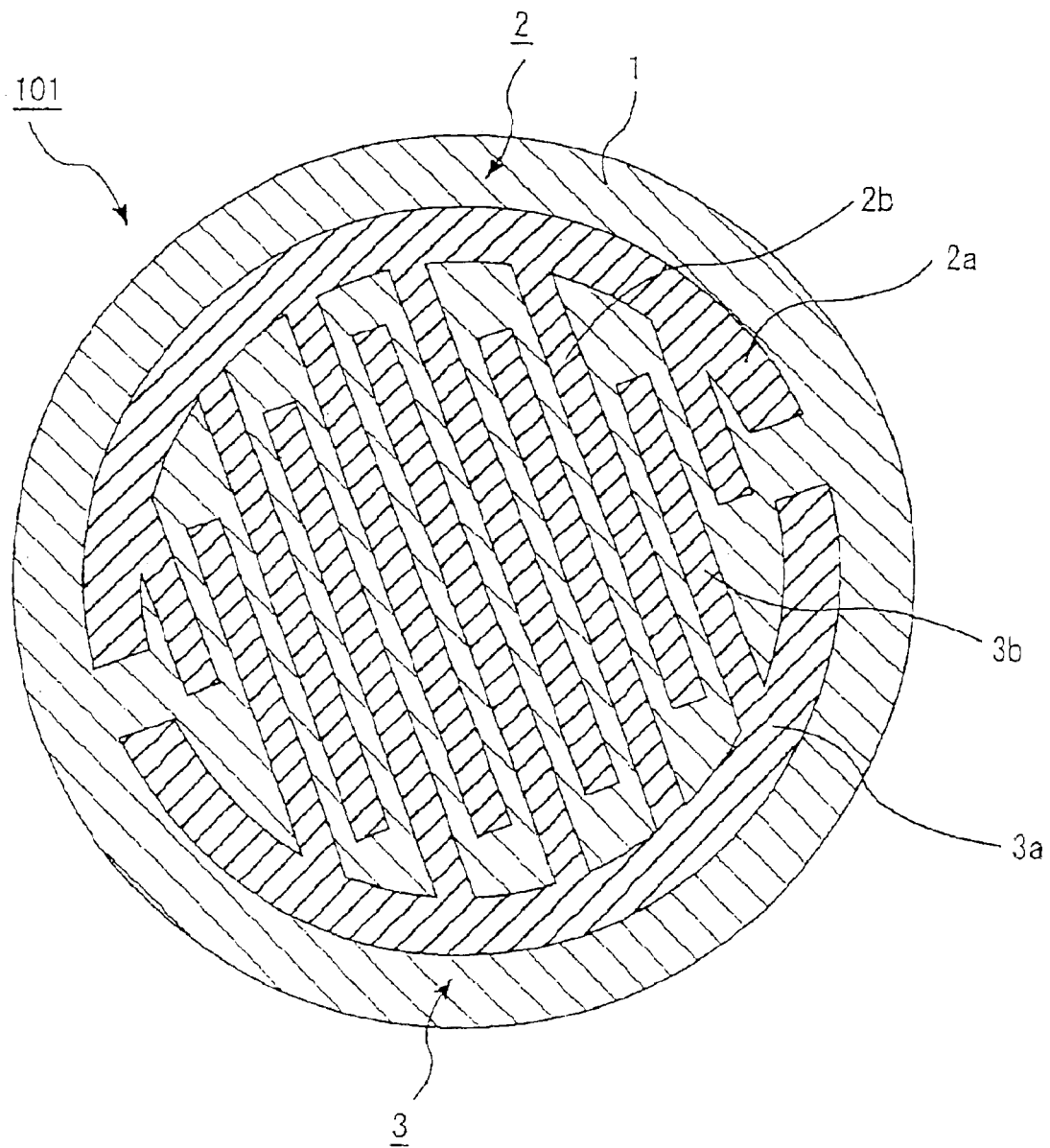
FIG. 4 is a sectional view taken on A—A line of the ceramic heater shown in FIG. 3.

FIG. 3 is a vertical sectional view that schematically shows one embodiment of the electrostatic chuck according to the present invention. FIG. 4 is a sectional view taken on A—A line of the electrostatic chuck shown in FIG. 3.

In this electrostatic chuck 101, an electrostatic electrode layer composed of a chuck positive electrostatic layer 2 and a chuck negative electrostatic layer 3 is embedded in a disk-shaped ceramic substrate 1. A thin ceramic layer 4 (hereinafter referred to as a ceramic dielectric film) is formed on the electrostatic electrode layer. A silicon wafer 9 is put on the electrostatic chuck 101 and is earthed.

As shown in FIG. 4, the chuck positive electrostatic layer 2 is composed of a semicircular part 2a and a comb-shaped part 2b. The chuck negative electrostatic layer 3 is also composed of a semicircular part 3a and a comb-shaped part 3b. These chuck positive electrostatic layer 2 and chuck negative electrostatic layer 3 are arranged opposite to each other so that the comb-shaped parts 2b and 3b cross each other. The positive side and the negative side of a direct current power source are connected to the chuck positive electrostatic layer 2 and chuck negative electrostatic layer 3, respectively. Thus, a direct current $V_2$ is applied thereto.

In order to control the temperature of the silicon wafer 9, resistance heating elements 5 in the form of concentric circles as viewed from the above, as shown in FIG. 1, are set up inside the ceramic substrate 1. External terminals are connected and fixed to both ends of the resistance heating elements 5, and a voltage $V_1$ is applied thereto. A bottomed hole into which a temperature-measuring element is inserted and an through hole through which a support pin (not illustrated) that supports the silicon wafer 9 and moves it up and down penetrates are made in the ceramic substrate 1, as shown in FIGS. 1 and 2 but not shown in FIGS. 3 and 4. The resistance heating elements may be formed on the bottom surface of the ceramic substrate.

When this electrostatic chuck 101 is operated, a direct current $V_2$ is applied to the chuck positive electrostatic layer 2 and the chuck negative electrostatic layer 3. In this way, the silicon wafer 9 is adsorbed onto these electrode through the ceramic dielectric film 4 by electrostatic action of the chuck positive electrostatic layer 2 and the chuck negative electrostatic layer 3. The silicon wafer 9 is fixed onto the electrostatic chuck 101 in this way, and subsequently the silicon wafer 9 is subjected to various treatments such as CVD.

In the electrostatic chuck 101, the ceramic dielectric film 4 is made of a nitride ceramic containing oxygen, and desirably has a porosity of 5% or less and a maximum pore diameter of 5 $\mu$m or less. The pores in this ceramic dielectric film 4 are desirably composed of pores independent on each other.

In the ceramic substrate constituting this electrostatic chuck, the number of the pores having a diameter of 0.5 $\mu$m or more is as small as $15\times10^2$ per m$^2$ or less. Thus, the ceramic substrate is sintered densely enough. Therefore, in this ceramic substrate, the temperature rising/dropping characteristics are superior and the breakdown voltage and Young's module thereof do not drop at a high temperature. No warp is caused in the ceramic substrate even at a high temperature of about 400 to 500° C.

Besides the resistance heating elements 12, a Peltier device (see FIG. 7) is mentioned as the temperature control means.

In the case that the Peltier device is used as the temperature control means, both heating and cooling can be attained by changing the direction along which an electric current passes. Thus, this case is advantageous.

Figure 7:
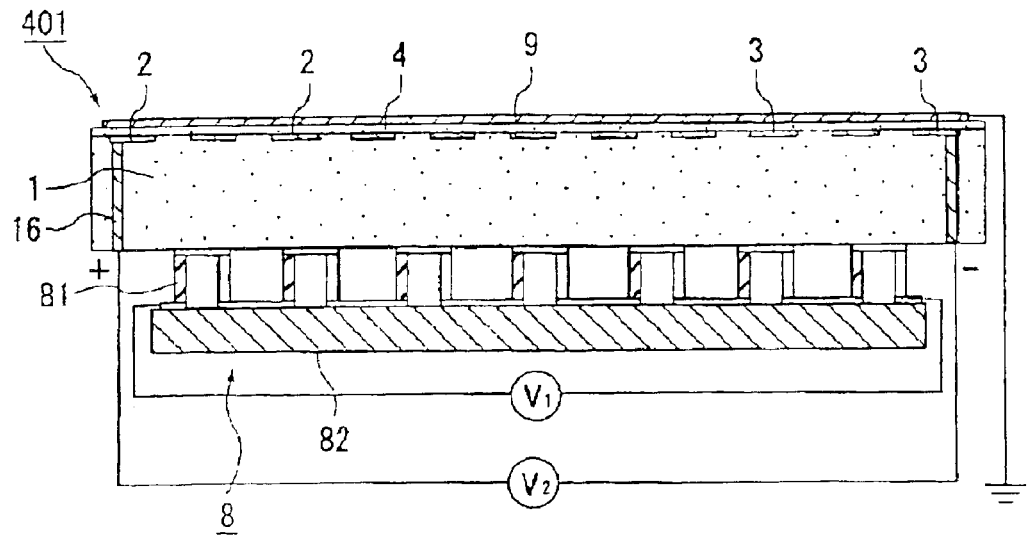
FIG. 7 is a sectional view that schematically shows one example of an electrostatic chuck using a ceramic substrate of the present invention.

As shown in FIG. 7, the Peltier device 8 is formed by connecting p type and n type thermoelectric elements 81 in series and then jointing the resultant to a ceramic plate 82.

Examples of the Peltier device include silicon/germanium, bismuth/antimony, and lead/tellurium materials.

The electrostatic chuck of the present invention has a structure as shown in, for example, FIGS. 3 and 4. The raw materials of the ceramic substrate and so on have already been described. The following will describe other respective members constituting the electrostatic chuck, and other embodiments of the electrostatic chuck of the present invention in detail and successively.

The ceramic dielectric film used in the electrostatic chuck of the present invention is preferably made of a nitride ceramic.

As this nitride ceramic, the same as materials of the above-mentioned ceramic substrate can be listed up. The nitride ceramic desirably contains oxygen. In this case, the sintering of the nitride ceramic advances easily. In the case that the nitride ceramic substrate includes pores, the pores are independent on each other so that the breakdown voltage is improved.

In order to incorporate oxygen into the nitride ceramic, a metal oxide is usually mixed with ingredient powder of the nitride ceramic, and then the mixture is sintered.

The metal oxide may be alumina ($Al_2O_3$), silicon oxide ($SiO_2$), and the like.

The added amount of such a metal oxide is preferably from 0.1 to 10 parts by weight per 100 parts by weight of the nitride ceramic.

By setting the thickness of the ceramic dielectric film to 50–5000 $\mu$m, sufficient breakdown voltage can be kept without lowering chucking power.

If the thickness of the ceramic dielectric film is below 50 $\mu$m, the thickness is too small so that sufficient breakdown voltage cannot be obtained. Thus, when a silicon wafer is put and adsorbed thereon, the ceramic dielectric film may undergo dielectric breakdown. On the other hand, if the thickness of the ceramic dielectric film is over 5000 $\mu$m, the distance between the silicon wafer and the electrostatic electrodes are large so that the capability of adsorbing the silicon wafer is lowered. The thickness of the ceramic dielectric film is preferably from 100 to 1500 $\mu$m.

Preferably, the porosity of the ceramic dielectric film is 5% or less and the diameter of maximum pores is 5 $\mu$m or less.

If the porosity is over 5%, the number of the pores increases and the diameter of the pores becomes too large so that the pores tend to be connected to each other. In the ceramic dielectric films having such a structure, their breakdown voltage drops.

When the diameter of the maximum pores is over 5 $\mu$m, breakdown voltage at a high temperature cannot be kept even if the number of the pores is made small. Also, it is difficult to raise the thermal conductivity. The porosity is preferably from 0.01 to 3%. The diameter of the maximum pores is preferably from 0.1 to 10 $\mu$m.

The number of the pores that are present in the ceramic dielectric film having such a structure and have a diameter of 0.5 $\mu$m or more is as small as $15\times10^{11}$ per m$^2$ or less. Thus, the ceramic dielectric film can be sufficiently densely sintered. Therefore, the following does not arise: corrosive gas and so on transmit through the ceramic dielectric film to corrode the electrostatic electrode.

The ceramic dielectric film desirably contains 50–5000 ppm of carbon. This is because carbon can hide the electrode pattern arranged in the electrostatic chuck and give high radiant heat Also, as the volume resistivity is lower, the adsorption power of the silicon wafer becomes higher at a low temperature.

The reason why pores may be present to some extent in the ceramic dielectric film in the present invention is that fracture toughness can be made high. In this way, thermal impact resistance can be improved.

The electrostatic electrode may be, for example, a sintered product made of a metal or a conductive ceramic, or a metal foil. As the metal sintered product, a product made of at least one selected from tungsten and molybdenum is preferable. The metal foil is preferably made of the same as the raw material of the metal sintered product. This is because these metals are not relatively liable to be oxidized and have sufficient conductivity for electrodes. As the conductive ceramic, at least one selected from carbides of tungsten and molybdenum can be used.

Figure 9:
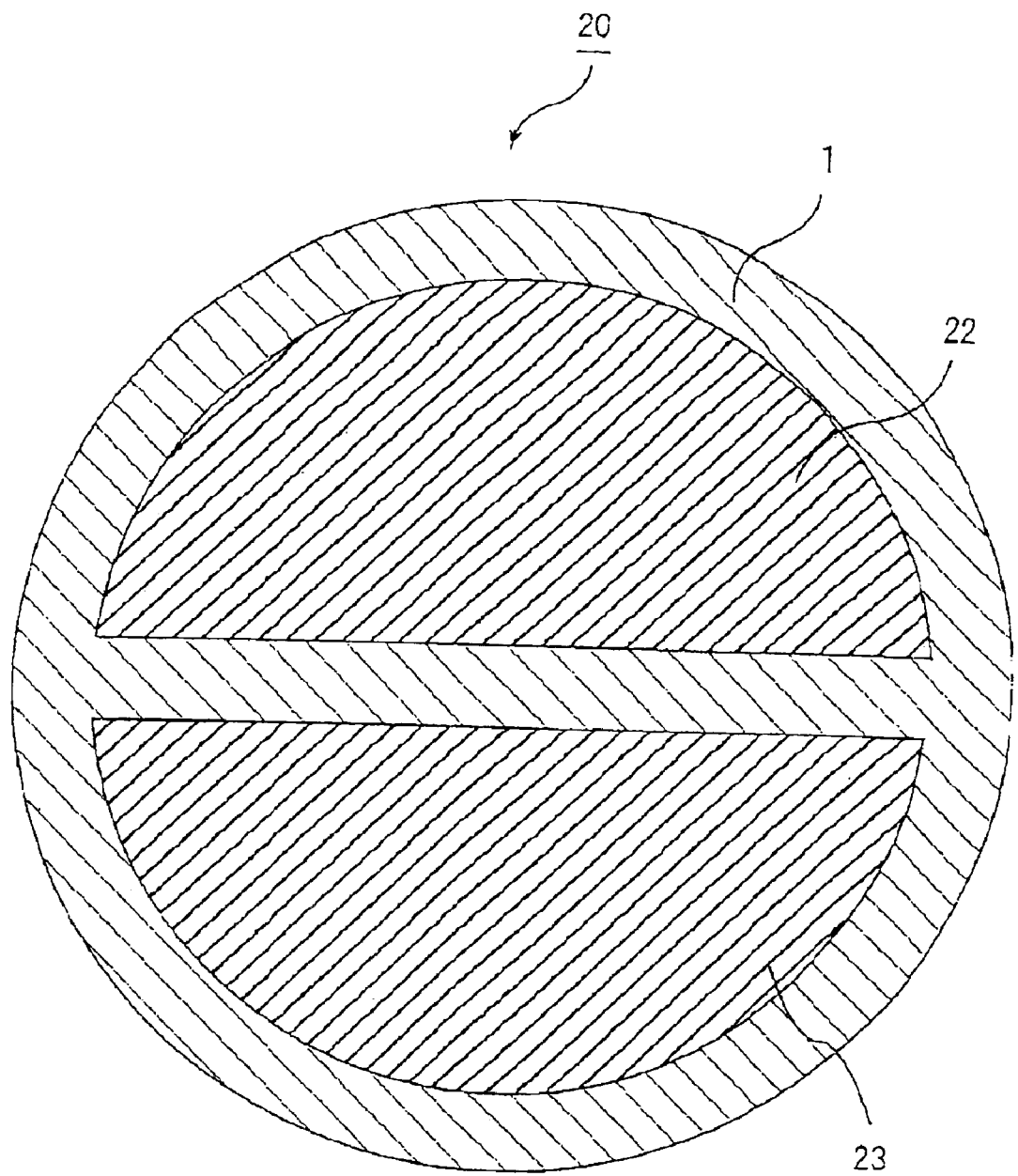
FIG. 9 is a horizontal sectional view that schematically shows the shape of an electrostatic electrode constituting an electrostatic chuck according to the present invention.
Figure 10:
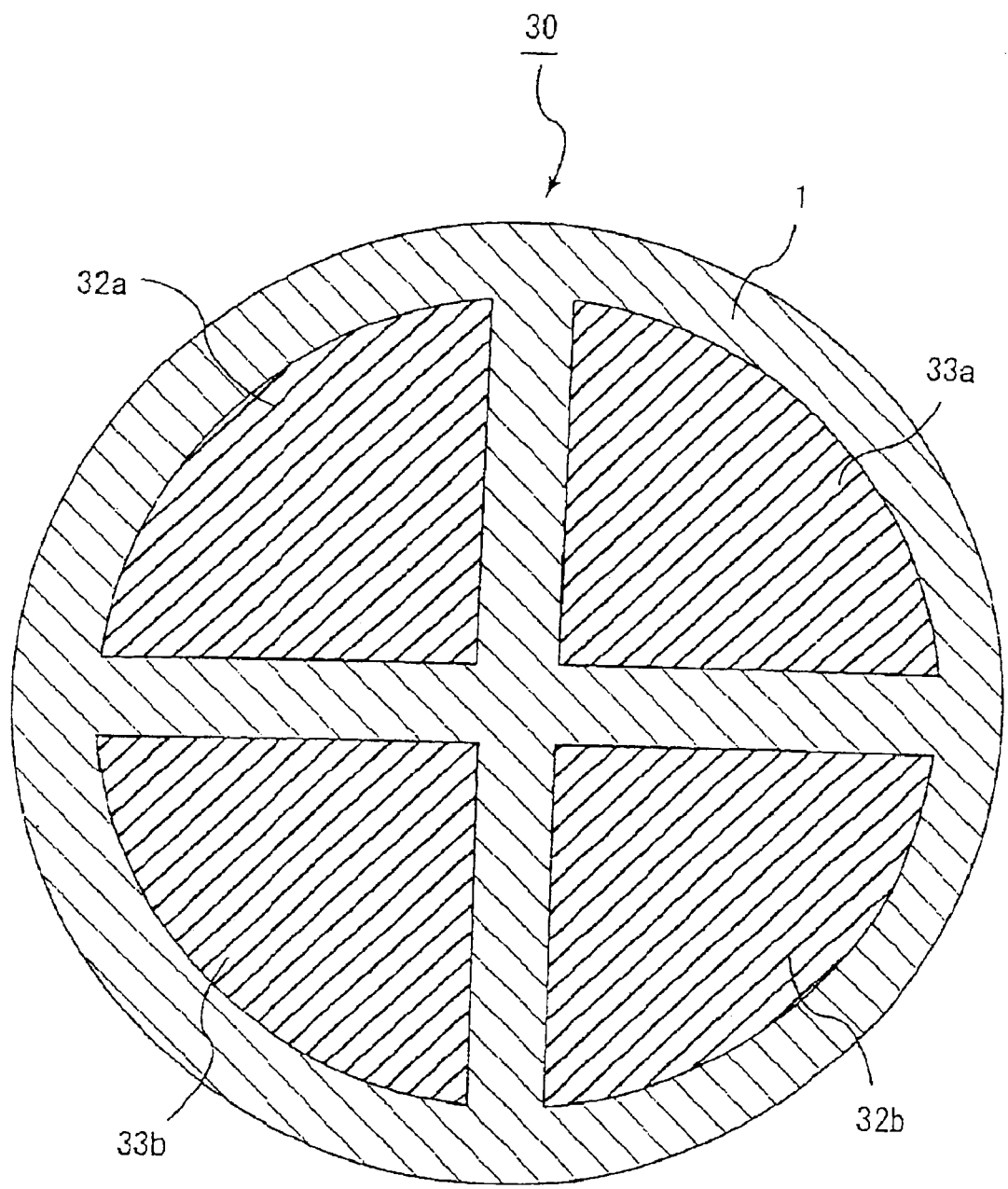
FIG. 10 is a horizontal sectional view that schematically shows the shape of an electrostatic electrode constituting an electrostatic chuck according to the present invention.
Figure 1:
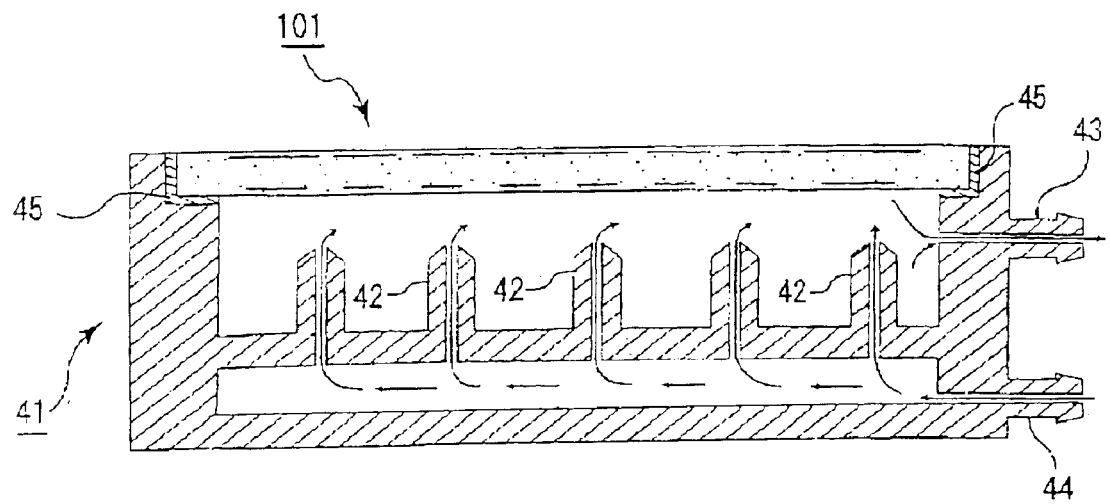
Figure 1:
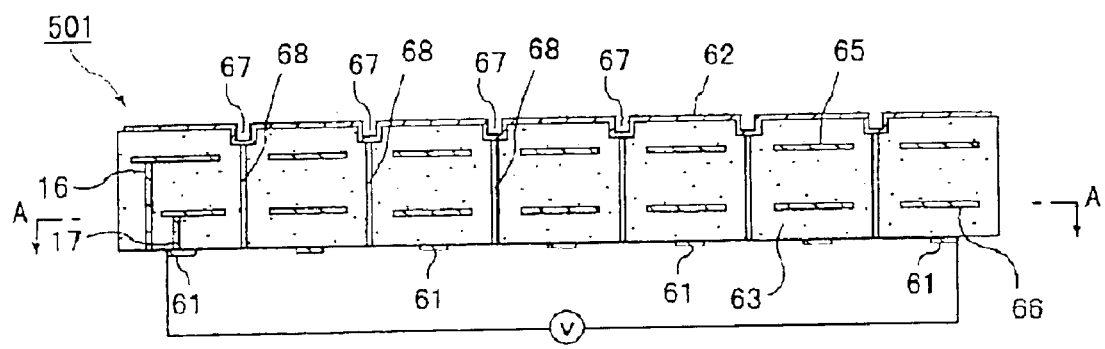

FIGS. 9 and 10 are horizontal sectional views that schematically show an electrostatic electrode in a different electrostatic chuck. In an electrostatic chuck 20 shown in FIG. 9, a chuck positive electrostatic layer 22 and a chuck negative electrostatic layer 23 in a semicircular form are formed inside a ceramic substrate 1. In an electrostatic chuck shown in FIG. 10, chuck positive electrostatic layers 32a, 32b and chuck negative electrostatic layers 33a, 33b, each of which has a shape obtained by dividing a circle into 4 parts, are formed inside a ceramic substrate 1. The two chuck positive electrostatic layers 22a, 22b and the two chuck negative electrostatic layers 33a, 33b are formed to cross.

In the case that an electrode in the shape of a circle and the like being divided is formed, the number of divided pieces is not particularly limited but may be 5 or more. Its shape is not limited to a sector.

Figure 6:
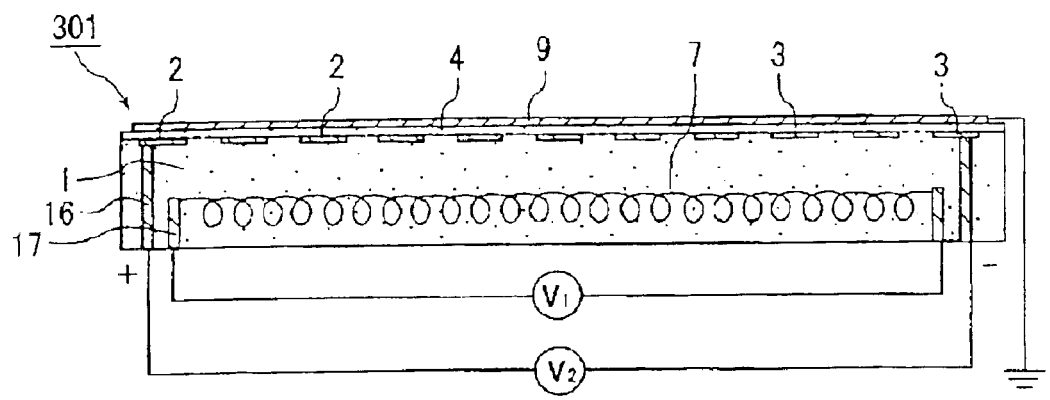
FIG. 6 is a sectional view that schematically shows one example of an electrostatic chuck using a ceramic substrate of the present invention.

Examples of the electrostatic chuck in the present invention include the electrostatic chuck 101 having a structure, wherein the chuck positive electrostatic layer 2 and the chuck negative electrostatic layer 3 are arranged between the ceramic substrate 1 and the ceramic dielectric film 4, and the resistance heating elements 5 are set up inside the ceramic substrate 1, as shown in FIG. 3; the electrostatic chuck 201 having a structure, wherein the chuck positive electrostatic layer 2 and the chuck negative electrostatic layer 3 are arranged between the ceramic substrate 1 and the ceramic dielectric film 4, and the resistance heating elements 25 is disposed on the bottom surface of the ceramic substrate 1, as shown in FIG. 5; the electrostatic chuck 301 having a structure, wherein the chuck positive electrostatic layer 2 and the chuck negative electrostatic layer 3 are arranged between the ceramic substrate 1 and the ceramic dielectric film 4, and the metal wire 7, which is a resistance heating element, is embedded in the ceramic substrate 1, as shown in FIG. 6; and the electrostatic chuck 401 having a structure, wherein the chuck positive electrostatic layer 2 and the chuck negative electrostatic layer 3 are arranged between the ceramic substrate 1 and the ceramic dielectric film 4, and the Peltier device 8 composed of the thermoelectric element 81 and the ceramic plate 82 is formed on the bottom surface of the ceramic substrate 1, as shown in FIG. 7.

As shown in FIGS. 3–7, in the present invention the chuck positive electrostatic layer 2 and the chuck negative electrostatic layer 3 are arranged between the ceramic substrate 1 and the ceramic dielectric film 4, and the resistance heating elements 5 or the metal wire 7 is formed inside the ceramic substrate 1. Therefore, connecting units (plated through holes) 16, 17 are necessary for connecting these to external terminals. The plated through holes 16, 17 are made by filling up blind holes with a high melting point metal such as tungsten paste or molybdenum paste, or a conductive ceramic such as tungsten carbide or molybdenum carbide.

The diameter of the connecting units (plated through holes) 16, 17 is desirably from 0.1 to 10 mm. This is because disconnection can be prevented and further cracks or strains can be prevented in this range.

Figure 8:
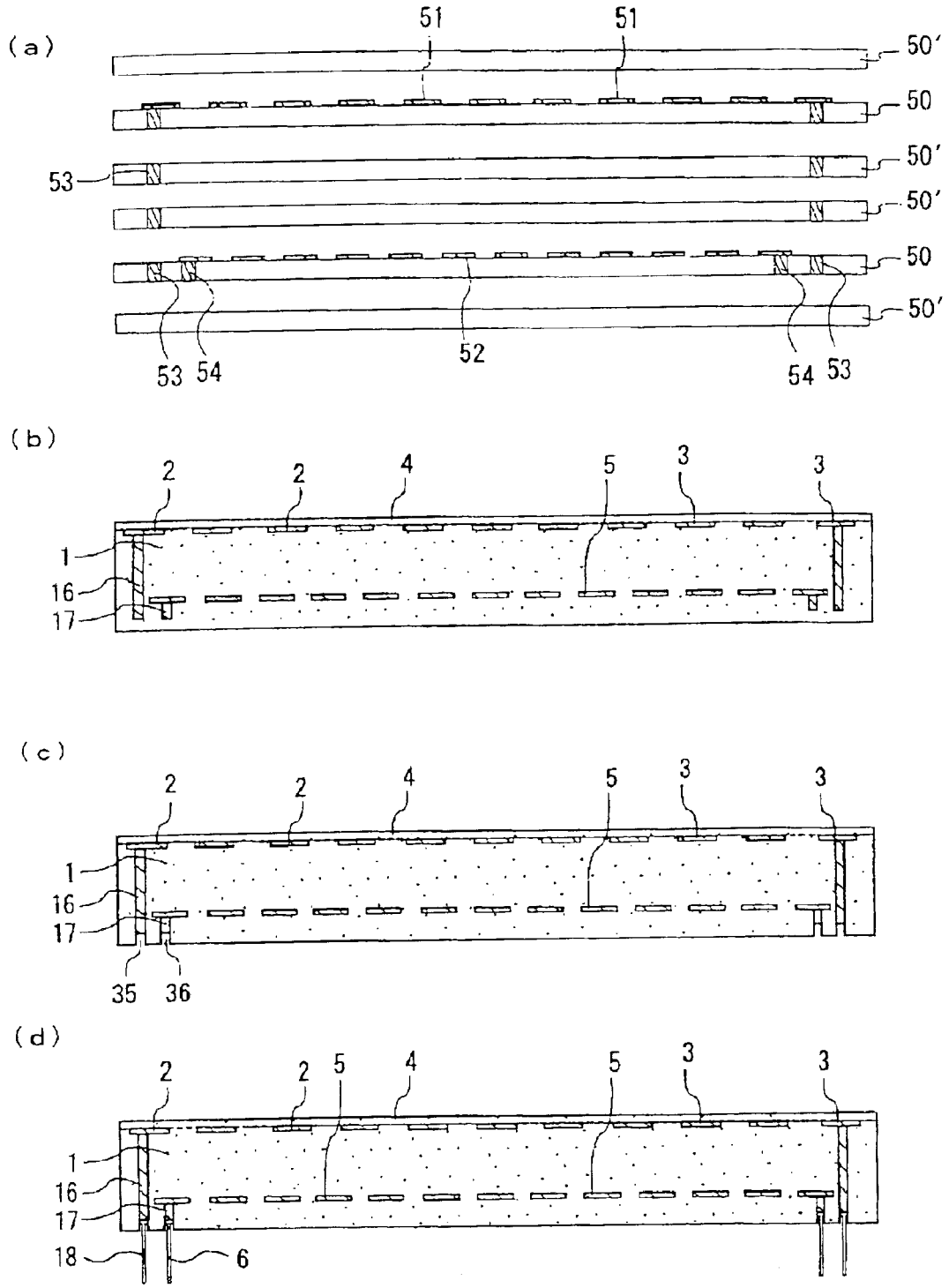
FIGS. 8(a)–(d) are sectional views that schematically show a part of the process for producing the electrostatic chuck shown in FIG. 5.

The plated through holes are used as connecting pads to connect external terminals 6, 18 (see FIG. 8(*d*)).

The connecting thereof is performed with solder or brazing-filler. As the brazing-filler, brazing silver, brazing palladium, brazing aluminum, or brazing gold is used. Brazing gold is desirably Au—Ni alloy since Au—Ni alloy is superior in adhesiveness to tungsten.

The ratio of Au/Ni is desirably [81.5–82.5 (% by weight)]/ [18.5–17.5 (% by weight)].

The thickness of the Au—Ni layer is desirably from 0.1 to 50 $\mu$m. This is because this range is a range sufficient for keeping connection. If Au—Cu alloy is used at a high temperature of 500–1000° C. and at a high vacuum of $10^{-6}$–$10^{-5}$Pa, the alloy deteriorates. However, Au—Ni alloy does not cause such deterioration and is profitable. When the total amount of the Au—Ni alloy is regarded as 100 parts by weight, the amount of impurities therein is desirably below 1 part by weight.

If necessary, in the present invention a thermocouple may be embedded in the bottomed hole in the ceramic substrate. This is because the thermocouple makes it possible to measure the temperature of the resistance heating element and, on the basis of the resultant data, voltage or electric current is changed so that the temperature can be controlled.

The size of the connecting portion of metal wires of the thermocouple is the same as the diameter of the strand of the respective metal wires or more, and is preferably 0.5 mm or less. Such a structure makes the thermal capacity of the connecting portion small, and causes a temperature to be correctly and speedy converted to a current value. For this reason, temperature control ability is improved so that the temperature distribution of the heated surface of the wafer becomes small.

Examples of the thermocouple include K, R, B, S, E, J and T type thermocouples, described in JIS-C-1602 (1980).

FIG. 11 is a sectional view that schematically shows a supporting case 41 into which the electrostatic chuck of the present invention, having a structure as described above, is fitted.

The electrostatic chuck 101 is fitted into the supporting case 41 through a heat insulator 45. Coolant outlets 42 are made in the supporting case 11, and a coolant is blown from a coolant inlet 44, passes through the coolant outlet 42, and go outside from an inhalation duct 43. By the action of this coolant, the electrostatic chuck 101 can be cooled.

The following will describe one example of the process for producing an electrostatic chuck as one example of the ceramic substrate of the present invention on the basis of sections shown in FIGS. 8(*a*)–(*d*).

(1) First, ceramic powder of a nitride ceramic, a carbide ceramic and the like is mixed with a binder and a solvent to obtain a green sheet 50.

As the ceramic powder, there may be used, for example, oxygen-containing aluminum nitride powder obtained by firing it in an oxidizable atmosphere. If necessary, a sintering aid such as alumina or sulfur may be added.

One or several green sheets 50' which are laminated on the green sheet on which electrostatic electrode layer printed element 51 that will be described later are formed are layers which will become a ceramic dielectric film 4; therefore, the sheet 50' may have a composition different from that of the ceramic substrate if necessary.

Usually, the same raw material is desirably used for the ceramic dielectric film 4 and the ceramic substrate 1. This is because these are sintered together in many cases so that the condition for the sintering are the same. In the case that the raw materials are different depending on the part, it is allowable that a ceramic substrate is first produced, an electrostatic electrode layer is formed thereon and then a ceramic dielectric film is formed thereon.

As the binder, at least one selected from an acrylic binder, ethylcellulose, butylcellusolve, and polyvinyl alcohol is desirable.

As the solvent, at least one selected from α-terpineol and glycol is desirable.

A paste obtained by mixing these is molded into a sheet using the doctor blade technique. Thus, the green sheet 50 is obtained.

If necessary, an through hole into which a supporting pin for a silicon wafer is inserted and a concave portion in which the thermocouple is embedded may be formed in the green sheet 50 and an through hole may also be formed in a portion where a plated through hole is to be formed. The through hole can be made by punching and the like.

The thickness of the green sheet is preferably from about 0.1 to 5 mm.

Next, a conductor containing paste is filled up into the through holes in the green sheet 50, to obtain plated through hole printed elements 53, 54. Next, a conductor containing paste that will be electrostatic electrode layers and resistance heating elements is printed on the green sheet 50.

The printing is performed to obtain a desired aspect ratio, considering the shrinkage ratio of the green sheet 50. In this way, electrostatic electrode layer printed elements 51 and resistance heating element layer printed elements 52 are obtained.

The printed elements are formed by printing a conductor containing paste containing conductive ceramic or metal particles, and the like.

As the conductive ceramic particles contained in the conductor containing paste, carbide of tungsten or molybdenum is optimal. This is because they are not easily oxidized and their thermal conductivity is not easily lowered. As the metal particles, tungsten, molybdenum, platinum, nickel and the like can be used. The average particle diameters of the conductive ceramic particles and the metal particles are preferably from 0.1 to 5 μm. This is because the conductor containing paste is not easily printed in either case that these particles are too large or too small.

As such a paste, the following conductor containing paste is optimal: a conductor containing paste prepared by mixing 85–97 parts by weight of the metal particles or the conductive ceramic particles; 1.5–10 parts by weight of at least one binder selected from acrylic binder, ethylcellulose, butylcellusolve and polyvinyl alcohol; 1.5–10 parts by weight of at least one solvent selected from α-terpineol, glycol, ethyl alcohol, and butanol.

Next, as shown in FIG. 8(*a*), the green sheet 50 having the printed elements 51, 52, 53, 54 and the green sheet 50' having no printed elements are made into a lamination. The reason why the green sheet 50' having no printed elements are placed at the side where the resistance heating elements are formed is that the following phenomenon is prevented: the end faces of the plated through holes are exposed and oxidized at the time of the sintering for the formation of the resistance heating elements. If the sintering for the formation of the resistance heating elements is performed in the state that the end faces of the plated through holes are exposed, it is necessary to sputter a metal which is not easily oxidized, such as nickel on it. More preferably, the end faces may be covered with brazing gold of Au—Ni.

(2) Next, as shown in FIG. 8(*b*), the lamination is heated and pressed to sinter the green sheet and the conductor containing paste.

Heating temperature is preferably from 1000 to 2000° C. and pressure is preferably from 100 to 200 kgf/cm². The heating and the pressing are performed in the atmosphere of inert gas. As the inert gas, argon, nitrogen and the like can be used. In this step, plated through holes 16, 17, the chuck positive electrostatic layer 2, the chuck negative electrostatic layer 3, the resistance heating elements 5 and so on can be formed.

(3) Next, as shown in FIG. 8(*c*), blind holes 35, 36 for connecting external terminals are formed.

It is desirable that at least a part of internal walls of the blind holes 35, 36 is made conductive and the conductive part of the internal walls is connected to the chuck positive electrostatic layer 2, the chuck negative electrostatic layer 3, the resistance heating elements 5 and so on.

(4) At last, as shown in FIG. 8(*d*), external terminals 6, 18 are set up to the blind holes 35, 36 through brazing gold. If necessary, a bottomed hole may be made so that a thermocouple may be embedded therein.

As solder, an alloy such as silver-lead, lead-tin or bismuth-tin can be used. The thickness of the solder layer is desirably from 0.1 to 50 μm. This is because this range is sufficient for maintaining the connection utilizing the solder.

In the above description, the electrostatic chuck 101 (see FIG. 3) is given as an example. In the case that the electrostatic chuck 201 (see FIG. 5) is produced, it is advisable to produce first a ceramic substrate having an electrostatic electrode layer, then print a conductor containing paste on the bottom surface of this ceramic substrate, sinter the resultant, subsequently form the resistance heating elements 25 and then form the metal covering layer 25*a* by electroplating and the like. In the case that the electrostatic chuck 301 (see FIG. 6) is produced, it is advisable that a metal foil or a metal wire is embedded as electrostatic electrodes and resistance heating elements in ceramic powder first and then the resultant is sintered.

In the case that the electrostatic chuck 401 (see FIG. 7) is produced, it is advisable that a ceramic substrate having an electrostatic electrode layer is produced first and then a Peltier device is jointed to the ceramic substrate through a flame sprayed metal layer.

The ceramic substrate functions as a wafer prober in the case that conductors are arranged on the surface of or inside the ceramic substrate of the present invention, and the conductive layer on the surface is a chuck top conductor layer and the conductor inside is either of a guard electrode or a ground electrode.

Figure 13:
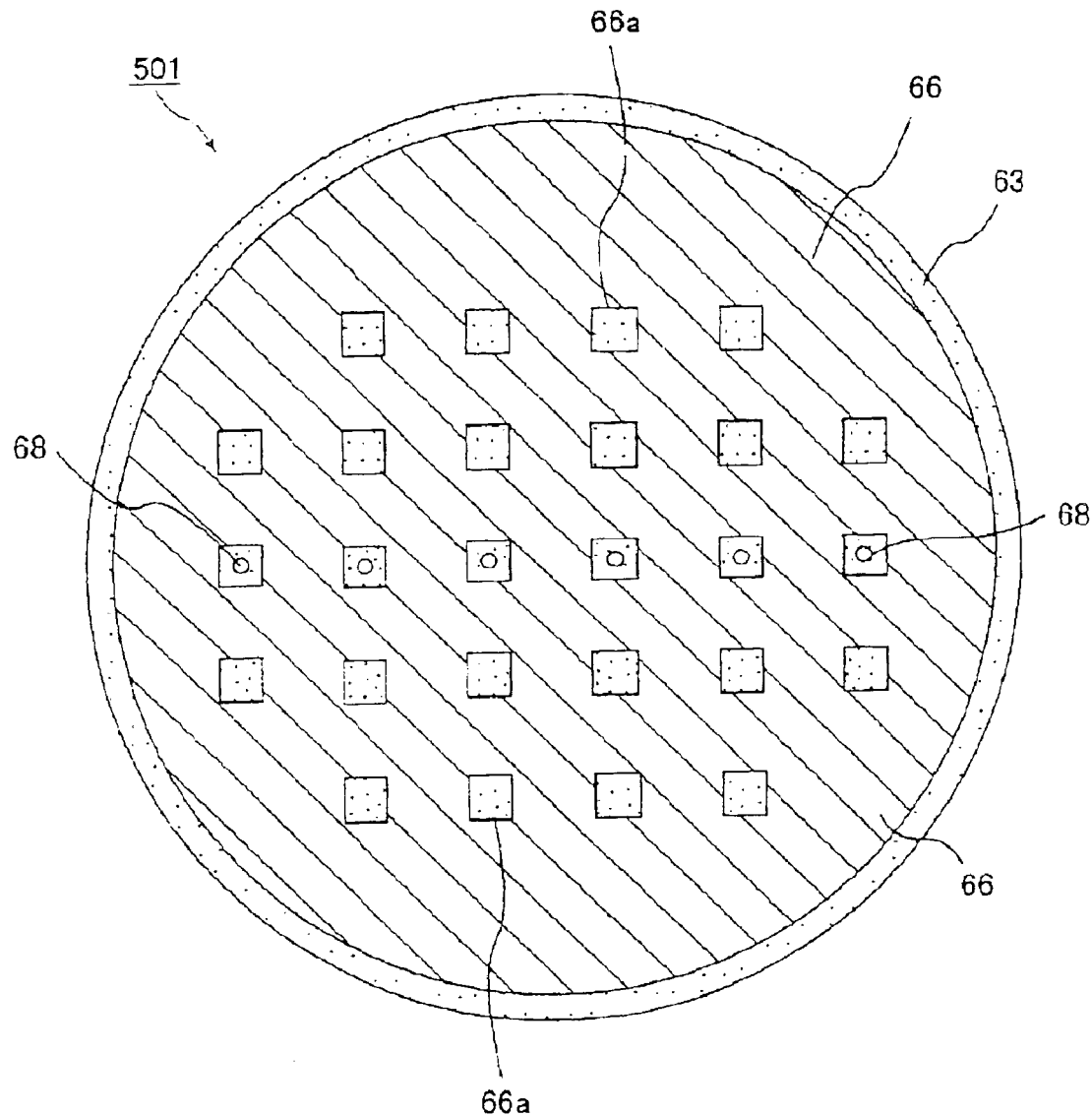
FIG. 13 is a sectional view that schematically shows guard electrodes of the wafer prober shown in FIG. 12.
Figure 14:
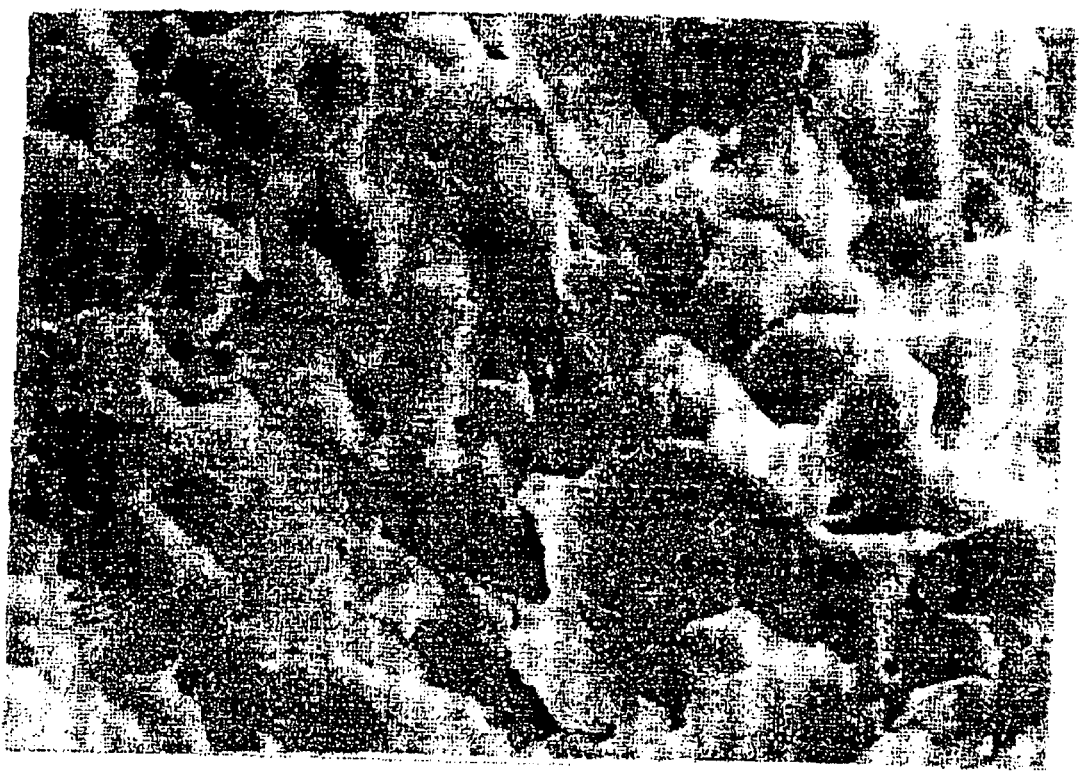
FIG. 14 is an electron microscopic photograph showing pores of a ceramic substrate.

FIG. 12 is a sectional view that schematically shows one embodiment of the wafer prober of the present invention. FIG. 13 is a sectional view taken along A—A line in the wafer prober shown in FIG. 12.

In this wafer prober 501, grooves 67, in the form of concentric circles as viewed from the above, are formed in the surface of a disc-form ceramic substrate 63. Moreover, suction holes 68 for sucking a silicon wafer are formed in a part of the grooves 67. A chuck top conductor layer 62 for the connection to electrodes of the silicon wafer is formed in a circular form in the greater part of the ceramic substrate 63 including the grooves 67.

Resistance heating elements 61 as shown in FIG. 1, in the form of concentric circles as viewed from the above, are disposed on the bottom surface of the ceramic substrate 63 to control the temperature of the silicon wafer. External terminals (not illustrated) are connected and fixed to both ends of the resistance heating element 61. Inside the ceramic substrate 63, guard electrodes 65 and ground electrodes 66 (see FIG. 13), in the form of a lattice as viewed from the above, are disposed in order to remove stray capacitor and noise. The raw material of the guard electrodes 65 and the ground electrodes 66 may be the same as that of the electrostatic electrode.

The thickness of the chuck top conductor layer 62 is desirably from 1 to 20 $\mu$m. If the thickness is below 1 $\mu$m, its resistance value is too high so as not to function as an electrode. On the other hand, if the thickness is over 20 $\mu$m, the layer exfoliates easily by stress that the conductor has.

As the chuck top conductor layer 62, there can be used, for example, at least one metal selected from high melting point metals such as copper, titanium, chromium, nickel, noble metals (gold, silver, platinum and so on), tungsten and molybdenum.

On the wafer prober having such a structure, a conduction test can be performed by putting a silicon wafer on which integrated circuits are formed, pushing a prove card having tester pins against the silicon wafer, and applying a voltage thereto while heating and cooling the wafer. In the ceramic substrate constituting this wafer prober, the number of pores having a diameter of 0.5 $\mu$m or more is as small as 15×10$^{11}$ per m$^2$ or less. Thus, the ceramic substrate is sufficiently densely sintered. Therefore, this ceramic substrate has superior temperature rising/dropping characteristics, and the breakdown voltage and Young's module thereof do not drop at a high temperature. Therefore, no warp is caused in the ceramic substrate even at a high temperature of about 400 to 500° C.

In the case that the wafer prober is produced, it is advisable, for example, to produce first a ceramic substrate in which resistance heating elements are embedded in the same way as in the case of the electrostatic chuck, then form grooves in the surface of the ceramic substrate, and subsequently subject the surface portion in which the grooves are made to sputtering, plating and the like to form a metal layer.

BEST MODES FOR CARRYING OUT THE INVENTION

The present invention will be described in more detailed hereinafter.

EXAMPLES 1–8

Production of an Electrostatic Chuck (see FIG. 6)
(1) Two electrodes having a shape shown in FIG. 9 were formed by punching a tungsten foil of 10 $\mu$m in thickness.

These two electrodes and a tungsten wire, together with 1000 parts by weight of aluminum nitride powder fired in the air at 500° C. for 1 hour (made by Tokuyama Corp. and the average particle diameter is shown in Table 1), 20 parts by weight of alumina (the average particle diameter: 0.4 $\mu$m) and 115 parts by weight of an acrylic binder, were put into a mold, and then the materials were hot-pressed in nitrogen gas at a temperature of 1890° C. and at a pressure of 0 to 200 kgf/cm$^2$ as shown in Table 1 for 3 hours, so as to obtain an aluminum nitride plate of 3 mm in thickness. This was cut into disc-form plates having a diameter of 230 mm. At this time, the thickness of its electrostatic electrode layer was 10 $\mu$m. In Example 8, however, 4 parts by weight of Y$_2$O$_3$ (the average particle diameter: 0.4 $\mu$m) were added. In any Examples, the diameter of the maximum pores of the resultant sintered product was 5 $\mu$m or less.
(2) Next, the plate obtained in the (1) was polished with a diamond grindstone. Subsequently a mask was put thereon, and bottomed holes (diameter: 1.2 mm, and depth: 2.0 mm) for thermocouples were made in the surface by blast treatment with SiC and the like.
(3) Furthermore, portions where the plated through holes were made were hollowed out to make blind holes. Brazing gold made of Ni—Au was heated and allowed to reflow at 700° C. to connect external terminals made of koval to the blind holes.

As to the connecting part of the external terminals, a structure, wherein a support of tungsten supports at three points, is desirable. This is because the reliability of the connection can be maintained.
(4) Next, thermocouples for controlling temperature were embedded in the bottomed holes to finish the production of an electrostatic chuck having resistance heating elements.

The number of pores present in the ceramic substrate (ceramic dielectric film) of the thus produced electrostatic chuck having the resistance heating elements, the breakdown voltage of the electrostatic chuck, the thermal conductivity thereof and so on were measured by methods that will be described below. The results are shown in Table 1.

COMPARATIVE EXAMPLE 1

The same manner as in Example 1 was carried out except that the average particle diameter of the aluminum nitride powder was set to 0.6 $\mu$m and the pressure upon the sintering was set to 40 kgf/cm$^2$, to obtain an electrostatic chuck.

About the resultant electrostatic chuck, the number of the pores, the breakdown voltage, the thermal conductivity and so on were measured by the following methods in the same manner as in Examples 1–8. The results are shown in Table 1.

Evaluation Method
(1) Measurement of the pores in the ceramic substrate (ceramic dielectric film)

Five samples were prepared. Their surfaces were polished into mirror planes. By means of an electron microscope, photographs of any ten points of the surfaces were taken with 2000 magnifications. On the taken photographs, the numbers of the pores having a diameter of 0.5 $\mu$m or more were counted, and then the average thereof was obtained. It was divided by the area of the field of view. In the case that the length of the pores along the lengthwise and lateral directions were different, the maximum value among them was adopted as the diameter.
(2) Evaluation of the breakdown voltage of the ceramic substrate (ceramic dielectric film)

On the electrostatic chucks produced in Examples 1–8 and Comparative Example 1, after putting a metal electrode thereon, and then a voltage was applied between the electrostatic electrode layer and the electrode to measure the voltage when dielectric breakdown occurred.
(3) Measurement in thermal conductivity
  a. Used equipment
  Rigaku laser flash method thermal constant measuring device
  LF/TCM-FA8510B b. Test conditions
Temperature: ambient temperature and 400° C.
Atmosphere: vacuum
c. Measurement method Temperature upon measurement of specific heat was detected with a thermocouple (Platinel), which was bonded to the surface of the sample with silver paste.

Specific heat at ambient temperature was measured in the state that a light receiving plate (glassy carbon) was bonded through silicone grease to the upper surface of the sample. The specific heat (Cp) of the sample was obtained by the following calculation equation (1):

$$Cp = \left\{ \frac{\Delta O}{\Delta T} - Cp_{G.C} \cdot W_{G.C} - Cp_{S.G} \cdot W_{S.G} \right\} \frac{1}{W} \quad (1)$$

In the above-mentioned calculation equation (1), $\Delta O$ is input energy, $\Delta T$ is the saturated value upon temperature-rising of the sample, $Cp_{G.C}$ is the specific heat of the glassy carbon, $W_{G.C}$ is the weight of the glassy carbon, $Cp_{S.G}$ is the specific heat of the silicone grease, $W_{S.G}$ is the weight of the silicone grease and the W is the weight of the sample.

(4) Measurement of fracture toughness

Using a Vicker's hardness meter (made by Akashi Seisaku-syo, MVK-D type), its indenter was pressed down on the surface to measure the length of a resultant crack. From this, the following calculation equation (2) was used to calculate fracture toughness:

$$\text{Fracture toughness} = 0.026 \times E^{1/2} \times 0.5 \times P^{1/2} \times a \times C^{-3/2} \quad (2)$$

wherein E is Young's modulus ($3.18 \times 10^{11}$ Pa), P is the pressing load (98 N), a is the half (m) of the average length of diagonal lines of the indentation, and C is the half (m) of the average of the lengths of the crack.

(5) Warp amount

The temperature of the sample was raised to 450° C. and a load of 150 kgf/cm$^2$ was applied thereto, and then the sample was cooled to 25° C. A shape-analyzer (made by Kyocera Corp., Nanoway) was used to measure the warp amount thereof.

amount thereof was small. On the other hand, the number of the pores that were present in the ceramic substrate constituting the electrostatic chuck according to Comparative Example 1 which had a diameter of 0.5 μm or more was over $15 \times 10^{11}$ per m$^2$. Therefore, the breakdown voltage of the ceramic substrate was relatively small, and the temperature rising/dropping characteristics was poor. The warp amount thereof was large. All of the results were poorer than the results of Example 1–8.

In Example 8 wherein no pore was presented, its breakdown voltage, warp amount and thermal conductivity were very good, whereas its fracture toughness was poor. If fracture toughness and so on are taken into consideration, the number of the pores is required to be $1 \times 10^8$ per m$^2$ or more. If warp amount at high temperatures and breakdown voltage are considered, it is best that the number of the pores is $5 \times 10^{10}$ per m$^2$ or less.

EXAMPLE 9

Production of the Wafer Prober 501 (see FIG. 12)

(1) Using a paste obtained by mixing 1000 parts by weight of aluminum nitride powder (made by Tokuyama Corp., and average particle diameter: 1.1 μm), 20 parts by weight of alumina (average particle diameter: 0.4 μm), 115 parts by weight of an acrylic binder, 5 parts by weight of polyether sulfone, 0.03 part by weight of silica, 5 parts by weight of a dispersant, and 530 parts by weight of alcohols consisting of 1-butanol and ethanol, molding was conducted by the doctor blade technique to obtain a green sheet having a thickness of 0.47 mm in thickness.

(2) Next, this green sheet was dried at 80° C. for 5 hours, and then through holes for plated through holes for connecting resistance heating elements to external terminals were made by punching.

(3) 100 parts by weight of tungsten carbide particles having an average particle diameter of 1 μm, 3.0 parts by weight of an acrylic binder, 3.5 parts by weight of α-terpineol, and 0.3 part by weight of a dispersant were mixed to prepare a conductor containing paste A.

Furthermore, 100 parts by weight of tungsten particles having an average particle diameter of 3 μm, 1.9 parts by weight of an acrylic binder, 3.7 parts by weight of

TABLE 1

|  | Particle diameter of ingredient particles | Pressure | Number of pores | Breakdown voltage (kV/mm) | | | Thermal conductivity (w/m · k) | | Warp amount | Fracture toughness |
| --- | --- | --- | --- | --- | --- | --- | --- | --- | --- | --- |
|  | (μm) | (kgf/cm$^2$) | (number/m$^2$) | 25° C. | 200° C. | 450° C. | 25° C. | 400° C. | (μm) | (Mpa · m$^{1/2}$) |
| Example 1 | 5 | 150 | $4 \times 10^8$ | 15 | 10 | 5 | 90 | 60 | 1 | 3.5 |
| Example 2 | 5 | 100 | $1 \times 10^9$ | 15 | 10 | 5 | 84 | 55 | 1 | 3.5 |
| Example 3 | 5 | 80 | $5 \times 10^9$ | 14 | 10 | 5 | 80 | 50 | 2 | 3.8 |
| Example 4 | 1.1 | 80 | $1 \times 10^{10}$ | 14 | 10 | 5 | 76 | 45 | 2 | 3.5 |
| Example 5 | 1.1 | 50 | $5 \times 10^{10}$ | 13 | 9 | 4 | 70 | 40 | 2 | 3.6 |
| Example 6 | 1.1 | 0 | $2 \times 10^{11}$ | 12 | 5 | 1 | 65 | 32 | 7 | 3.5 |
| Example 7 | 0.6 | 50 | $10 \times 10^{11}$ | 10 | 4 | 1 | 60 | 30 | 7 | 3.4 |
| Example 8 | 0.6 | 200 | 0 | 20 | 15 | 10 | 180 | 110 | 0 | 3.0 |
| Comparative Example 1 | 0.6 | 40 | $18 \times 10^{11}$ | 2 | 0.8 | 0.4 | 30 | 10 | 8 | 2.8 |

As is clear from the results shown in Table 1, the number of the pores that were present in the ceramic substrates constituting the electrostatic chucks according to Example 1–8 and that has a diameter of 0.5 μm or more was $15 \times 10^{11}$ per m$^2$ or less. Therefore, the breakdown voltage of these ceramic substrates showed a large value, and the temperature rising/dropping characteristics were good. The warp α-terpineol, and 0.2 part by weight of a dispersant were mixed to prepare a conductor containing paste B.

Next, lattice-form guard electrode printed elements and ground electrode printed elements were printed on the green sheet by screen printing using this conductor containing paste A.

The conductor containing paste B was filled up into the through holes for plated through holes for connection to external terminals.

The green sheets having the printed elements and green sheets having no printed elements, the number of those was 50, were laminated and integrated with each other at 130° C. by a pressure of 80 kgf/cm² to produce a lamination.

(4) Next, this lamination was subjected to degreasing in nitrogen gas at 600° C. for 5 hours and hot-pressing at 1890° C. and a pressure of 150 kgf/cm² for 3 hours to obtain an aluminum nitride plate of 3 mm in thickness. The resultant plate was cut into a disc of 300 mm in diameter to prepare a plate made of the ceramic. Regarding the size of the plated through holes 16, its diameter was 0.2 mm and its depth was 0.2 mm.

The thickness of the guard electrodes 65 and the ground electrodes 66 was 10 $\mu$m. The position where the guard electrodes 65 were formed was away by 1 mm from the wafer-putting surface. The position where the ground electrodes 66 were formed was a position that was away by 1.2 mm from the wafer-putting surface. The length of one side of non-conductor formed areas 66a in the guard electrodes 65 and the ground electrodes 66 was 0.5 mm.

(5) The plate obtained in the (4) was polished with a diamond grindstone. Subsequently a mask was put thereon, and concave portions for thermocouples and grooves 67 (width: 0.5 mm, and depth: 0.5 mm) for adsorbing a wafer were made on the surface by blast treatment with SiC and the like.

(6) Furthermore, a layer for forming the resistance heating elements 61 was printed on the surface opposite to the wafer-putting surface. For the printing, a conductor containing paste was used. As the conductor containing paste, Solbest PS603D made by Tokuriki Kagaku Kenkyusho, which is used for forming plated through holes in a printed circuit board, was used. This conductor containing paste was a silver/lead paste, and contained 7.5 parts by weight of metal oxides made of lead oxide, zinc oxide, silica, boron oxide and alumina (the weight ratio thereof was 5/55/10/25/5) per 100 parts by weight of silver.

The shape of the silver was a scaly form having an average particle diameter of 4.5 $\mu$m.

(7) The ceramic substrate on which the conductor containing paste was printed was heated and sintered at 780° C., to sinter silver and lead in the conductor containing paste and bake the paste on the ceramic substrate 63. Furthermore, the ceramic substrate was immersed in an electroless nickel plating bath comprising 30g/L of nickel sulfate, 30 g/L of boric acid, 30 g/L of ammonium chloride and 60 g/L of Rochelle salt to precipitate a nickel layer (not illustrated) having a thickness of 1 $\mu$m and a boron content of 1% by weight or less on the surface of the resistance heating elements 61 made of sintered silver. Thereafter, the ceramic substrate was subjected to annealing treatment at 120° C. for 3 hours.

Regarding the resistance heating elements made of sintered silver, its thickness was 5 $\mu$m, its width was 2.4 mm, and it's area resistivity was 7.7 m$\Omega$/□.

(8) By sputtering, a titanium layer, a molybdenum layer and a nickel layer were successively formed on the surface on which the grooves 67 were formed. As the machine for the sputtering, SVMR-4540 made by ULVAC Japan, Ltd. was used. Regarding the conditions of the sputtering, pressure was 0.6 Pa, temperature was 100° C. and electric power was 200 W. Sputtering time was within the range of 30 seconds to 1 minute and was adjusted depending on the respective metals.

Regarding the thickness of the resultant, the thickness of the titanium layer was 0.3 $\mu$m, that of the molybdenum layer was 2 $\mu$m and that of the nickel layer was 1 $\mu$m, based on the observation from images on a fluorescent X ray analyzer.

(9) The ceramic substrate obtained in the (8) was immersed in an electro nickel plating bath comprising 30 g/L of nickel sulfate, 30 g/L of boric acid, 30 g/L of ammonium chloride and 60 g/L of Rochelle salt to precipitate a nickel layer having a thickness of 7 $\mu$m and a boron content of 1% by weight or less on the surface of the metal layer formed by the sputtering. The ceramic substrate was subjected to annealing treatment at 120° C. for 3 hours.

No electric current passes through the surfaces of the resistance heating elements, and the surfaces were not covered with electroplating.

Furthermore, the ceramic substrate was immersed in an electroless gold plating solution comprising 2 g/L of potassium gold cyanide, 75 g/L of ammonium chloride, 50 g/L of sodium citrate and 10 g/L of sodium hypophosphite at 93° C. for 1 minutes to form a gold plating layer 1 $\mu$m in thickness on the nickel plating layer.

(10) The suction holes 68 passing out from the grooves 67 to the opposite side were formed by drilling. Furthermore, blind holes (not illustrated) for exposing the plated through holes 16 were made. Brazing gold made of Ni—Au arroy (Au: 81.5% by weight, Ni: 18.4% by weight and impurities: 0.1% by weight) was heated and allowed to reflow at 970° C. to connect external terminals made of koval to the plated through hole in the blind hole. External terminals made of koval were formed through solder (90% by weight of tin/10% by weight of lead) on the resistance heating elements.

(11) Next, thermocouples for controlling temperature were embedded in the concave portions, to obtain the wafer prober heater 501 with the heaters.

When this wafer prober with the heaters was heated to 200° C., the temperature reached 200° C. in about 20 seconds.

The ceramic substrate constituting the wafer prober with the heaters was cut out for the measurement. In the same way as in Example 1, the number of the pores that were present in this ceramic substrate and have a diameter of 0.5 $\mu$m or more was measured. As a result, the number was $1.5 \times 10^{10}$ per m².

INDUSTRIAL APPLICABILITY

As described above, the ceramic substrate of the present invention is sintered in the manner that the number of pores having a diameter of 0.5 $\mu$m or more becomes $15 \times 10^{11}$ per m²or less. Thus, its temperature rising/dropping characteristics are superior, and its breakdown voltage is large. Moreover, its warp amount is small.

What is claimed is:

1. A ceramic heater comprising a ceramic substrate and a temperature control means, wherein the number of pores with a diameter of 0.5 $\mu$m or more obtained by surface measurement of said ceramic substrate with a microscope is $1 \times 10^8$ to $15 \times 10^{11}$ per m².

2. The ceramic heater according to claim 1, wherein said ceramic substrate has a thickness of 1 to 25 mm.

3. The ceramic heater according to claim 1, wherein said temperature control means is a Peltier device.

4. The ceramic heater according to claim 1,
wherein said temperature control means is arranged inside of said ceramic substrate.

5. The ceramic heater according to claim 1,
wherein said ceramic substrate comprises an electrostatic electrode.

6. The ceramic heater according to claim 1,
wherein a chuck top conductor layer is formed on the surface of said ceramic substrate.

7. The ceramic heater according to claim 1,
wherein said ceramic substrate contains carbon.

8. The ceramic heater according to claim 1,
wherein said ceramic substrate comprises an oxide ceramic.

9. The ceramic heater according to claim 1,
wherein said ceramic substrate comprises a non-oxide ceramic containing 0.1 to 20% by weight of oxygen.

10. The ceramic heater according to claim 1,
which is used to heat a semiconductor wafer.

* * * * *